(12) United States Patent
Kikuchi et al.

(10) Patent No.: US 6,507,944 B1
(45) Date of Patent: Jan. 14, 2003

(54) DATA PROCESSING METHOD AND APPARATUS, RETICLE MASK, EXPOSING METHOD AND APPARATUS, AND RECORDING MEDIUM

(75) Inventors: Kenji Kikuchi, Kawasaki (JP); Yoshimasa Ilduka, Kawasaki (JP); Tomoyuki Okada, Kawasaki (JP); Masahiko Minemura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/533,663

(22) Filed: Mar. 23, 2000

(30) Foreign Application Priority Data

Jul. 30, 1999 (JP) .......................... 11-216957
Jul. 30, 1999 (JP) .......................... 11-216958

(51) Int. Cl.$^7$ .......................... G06F 17/50; G06F 19/00
(52) U.S. Cl. .............. 716/21; 716/3; 700/97; 700/105; 700/120; 700/121; 430/5; 378/35; 382/144
(58) Field of Search ............ 716/1–21; 700/96, 700/97, 105, 120–121; 430/4–5; 378/34–35; 382/144

(56) References Cited

U.S. PATENT DOCUMENTS

| | | | | |
|---|---|---|---|---|
| 5,553,274 A | * | 9/1996 | Liebmann | 716/21 |
| 5,636,132 A | * | 6/1997 | Kamdar | 716/2 |
| 5,656,399 A | * | 8/1997 | Abate et al. | 378/34 |
| 6,033,812 A | * | 3/2000 | Miyagawa | 430/5 |
| 6,136,478 A | * | 10/2000 | Usui et al. | 430/5 |
| 6,145,118 A | * | 11/2000 | Tomita | 716/21 |
| 6,202,191 B1 | * | 3/2001 | Filippi et al. | 716/5 |
| 6,230,304 B1 | * | 5/2001 | Groeneveld et al. | 716/7 |
| 6,370,441 B1 | * | 4/2002 | Ohnuma | 700/121 |
| 6,401,235 B1 | * | 6/2002 | Ashida | 716/19 |

FOREIGN PATENT DOCUMENTS

| | | | | |
|---|---|---|---|---|
| JP | 4-310952 | 11/1992 | | G03F/1/08 |
| JP | 9-198413 | 7/1997 | | G06F/17/50 |

* cited by examiner

*Primary Examiner*—Matthew Smith
*Assistant Examiner*—Phallaka Kik
(74) *Attorney, Agent, or Firm*—Staas & Halsey LLP

(57) ABSTRACT

A data processing apparatus comprises a grid pattern area calculation section (24) for calculating the minimum grid and the present area of a circuit element for each layer of circuit patterns given by CAD data (1); an overlap area calculation section (25) for calculating an overlap area of present areas; and a composition/division optimization judgment section (26) for judging by a criterion whether the layers including the overlap area should be processed according to a single common grid or different grids. Each layer can be assigned the grid with the minimum accuracy required for the layer. A grid with more minute accuracy than it requires may not be used. Operation load in making reticle mask data and processing load in actually performing exposure or the like are thereby considerably relieved.

8 Claims, 12 Drawing Sheets

FIG. 3
(PRIOR ART)
101 DESIGN DATA (FIRST)
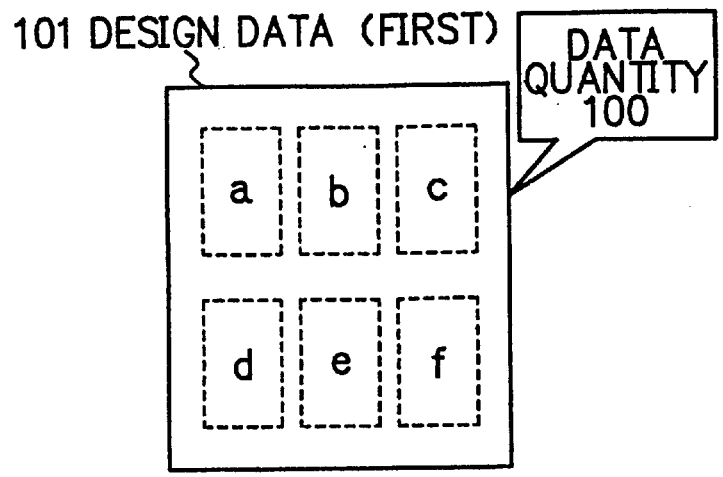
DATA QUANTITY 100
☐ IS GROUP OF CELLS, AND MODULE
111 DATA PROCESSING
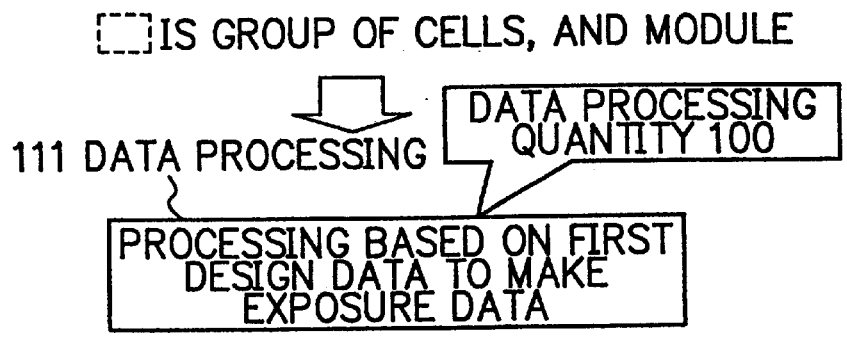
DATA PROCESSING QUANTITY 100
PROCESSING BASED ON FIRST DESIGN DATA TO MAKE EXPOSURE DATA
102 FIRST EXPOSURE DATA
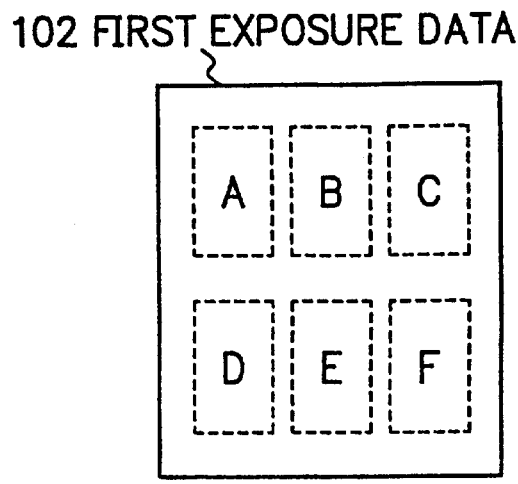

FIG. 4
(PRIOR ART)
105 DESIGN DATA (REVISED)
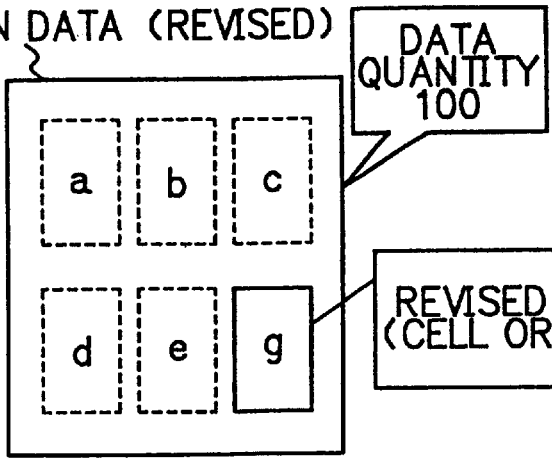
□ IS GROUP OF CELLS, AND MODULE
116 DATA PROCESSING
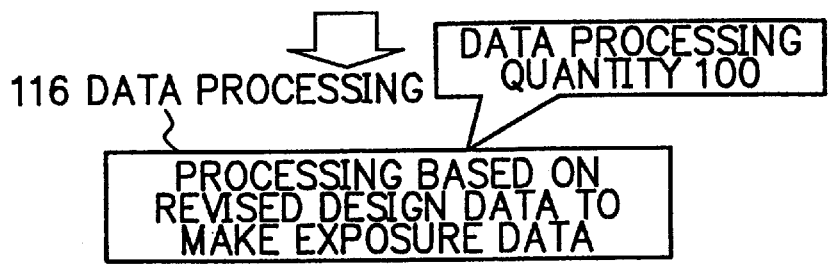
107 REVISED EXPOSURE DATA
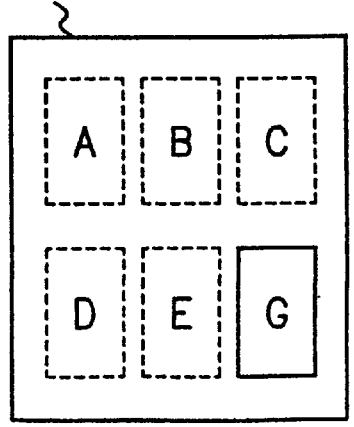

FIG. 6A CALCULATION OF MINIMUM GRID

| Layer | Grid (μm) |
|---|---|
| A | 0.01 |
| B | 0.02 |
| C | 0.05 |
| D | 0.1 |

FIG. 6B CALCULATION OF PRESENT AREA

| Layer | AREA (μm²) |
|---|---|
| A | 6 |
| B | 10 |
| C | 2 |
| D | 2 |

FIG. 6C CALCULATION OF OVERLAP AREA

| Layer | A | B | C | D |
|---|---|---|---|---|
| A | ✕ | ✕ | ✕ | ✕ |
| B | W: 5 μm² | ✕ | ✕ | ✕ |
| C | ✕ | Z: 1 μm² | ✕ | ✕ |
| D | ✕ | ✕ | ✕ | ✕ |

FIG. 6D CALCULATION OF NUMBER OF EXPOSURE PIXELS

| | 0.01 μm | 0.02 μm | 0.05 μm | 0.1 μm |
|---|---|---|---|---|
| A: 6 μm² | 600 | ✕ | ✕ | ✕ |
| B: 10 μm² | 1000 | 500 | ✕ | ✕ |
| C: 2 μm² | 200 | ✕ | 40 | ✕ |
| D: 2 μm² | 200 | 100 | 40 | 20 |

FIG. 6E

CALCULATION OF COMBINATION GRID

|         | A: 0.01 | B: 0.02 | C: 0.05 | D: 0.1 |
|---------|---------|---------|---------|--------|
| A: 0.01 |         |         |         |        |
| B: 0.02 | 0.01    |         |         |        |
| C: 0.05 | 0.01    | 0.01    |         |        |
| D: 0.1  | 0.01    | 0.02    | 0.05    |        |

FIG. 6F

DETECTION OF PERMISSIBLE GRID

PERMISSIBLE GRID TABLE

|         | 0.01 | 0.02 | 0.05 | 0.1 |
|---------|------|------|------|-----|
| A: 0.01 | O    |      |      |     |
| B: 0.02 | O    | O    |      |     |
| C: 0.05 | O    |      | O    |     |
| D: 0.1  | O    | O    | O    | O   |

FIG. 6G

CALCULATION OF LARGEST THROUGHPUT

LAYER COMBINATION TABLE  ☆0.01  ◉0.02  ×0.05  △0.1

| | | | | | | | | |
|---|---|---|---|---|---|---|---|---|
| A: 6 | ☆ | ☆ | ☆ | ☆ | ☆ | ☆ | ☆ | ☆ |
| B: 10 | ☆ | ☆ | ☆ | ☆ | ☆ | ☆ | ☆ | ☆ |
| C: 2 | × | × | × | × | ☆ | ☆ | ☆ | ☆ |
| D: 2 | △ | × | ◉ | ☆ | △ | × | ◉ | ☆ |
| TOTAL NUMBER pixel | 1160 | 1180 | 1240 | 1340 | 1320 | 1340 | 1400 | 1500 | as patent content on a page

DATA PROCESSING METHOD AND APPARATUS, RETICLE MASK, EXPOSING METHOD AND APPARATUS, AND RECORDING MEDIUM

BACKGROUND OF THE INVENTION

1. [Field of the Invention]

The present invention relates to data processing methods and apparatus, exposing methods and apparatus, recording media that stores programs for implementing the above methods and apparatus by function of software, and reticle masks made according to the above data processing methods, particularly to apparatus and methods for making reticle mask data (exposure data, check data, and verification data) from design data for manufacturing LSIs such as semiconductor devices, magnetic devices, liquid crystal devices, or printed circuit boards, and methods of performing exposure according to the reticle mask data.

2. [Description of the Related Art]

In a manufacturing process of LSIs such as semiconductor devices, design data that symbolically represents the circuit layouts on each semiconductor device to be manufactured, is first prepared by CAD (Computer-Aided Design) or the like. Data of a reticle, a photomask, or the like, (reticle mask data) representing a layout pattern used as an original for processing wafers, is then made on the basis of the design data. A photosensitive material is exposed according to the reticle mask data to make a reticle mask. The reticle mask is used for printing on wafers.

FIG. 1 is a block diagram showing a conventional data processing apparatus for making reticle mask data from design data. Referring to FIG. 1, the data processing apparatus 200 performs data processing to CAD data 1, which symbolically represents circuit layouts, to make reticle mask data 2. In accordance with the obtained reticle mask data 2, an exposing apparatus (not shown) performs exposure to make a reticle mask 3.

At first in the data processing apparatus 200, an apparatus grid data calculation section 6 calculates grid data on the basis of reticle accuracy data 4 and processing parameters 5 being input. The grid data is used for determining the basic size of the layout pattern of the reticle mask data 2 when the reticle mask data 2 is made from a circuit layout in the CAD data 1.

The grid data is made in the permissible minimum actual size in accordance with the minimum grid when the CAD data 1 is made, accuracy in pattern size on the reticle mask 3, etc. More specifically, the grid data is made such that every edge of the pattern data of any circuit element constituting the reticle mask data 2, is at a lattice point of the matrix defined according to the basic size set by the grid data.

The above-mentioned reticle accuracy data 4 gives information on permissible range of error in printing on wafers with the reticle mask 3 being made. The above-mentioned processing parameters 5 include various data such as layer composition data, sizing data, and scale data, which will be described below.

The layer composition data gives information on layer groups in case of dividing circuit patterns to make up the aimed semiconductor device, into layers in accordance with the roles and features of the circuit patterns, processing technique, conditions, etc. That is, the layer composition data gives information as to which layer each circuit pattern belongs to.

The sizing data gives information on size of each circuit pattern contained in the CAD data 1. The scale data gives information on scale of enlargement of the whole semiconductor chip represented by the CAD data 1. More specifically, the reticle mask data 2 is made by enlarging the CAD data 1 in accordance with the scale given by this scale data. Printing with the reticle mask 3 made according to the reticle mask data 2, is performed with reduction to the same scale as that of the original CAD data 1.

Next, an internal format conversion section 7 converts necessary one or ones of the CAD data 1, the reticle accuracy data 4, the processing parameters 5, and the grid data calculated by the apparatus grid data calculation section 6, into data 8 in accordance with the internal format of the data processing apparatus 200. A logical operation processing section 9 then performs logical operation to the converted internal format data 8 to perform processing of layer composition, sizing, enlargement, or the like, given by the processing parameters 5. Operated internal format data 10 is thereby made.

A format conversion/output section 11 then converts, in format, the operated internal format data 10 thus obtained, into data for exposing, and outputs it. The reticle mask data 2 is thereby made. The reticle mask data 2 thus obtained is circuit pattern data miniaturized according to the basic size of the grid data. Processing technique of, e.g., printing, varies in accordance with difference in the basic size of the pattern data.

The reticle mask data 2 made in the above data processing apparatus 200, includes check data and verification data in addition to the exposure data as described above. The check data is layout data for checking whether the circuit pattern formed on a substrate on the basis of the exposure data, has its correct pattern. This check data is made in the same process as the exposure data. The verification data is layout data for verifying on data whether the obtained reticle mask data 2 has its correct pattern, in a stage prior to printing on the substrate. This verification data is also made in the same process as the exposure data.

Recent development of LSI is being larger-scale with advance in CAD tool, and the term for development is requested to be short. With this, it is requested to put quickly a large number of high-quality LSIs on the market. For this purpose, there has arisen the necessity of making each reticle mask with high accuracy used as a base in manufacturing semiconductor chips, in a short time, and of shortening the time for making reticle check data and verification data.

In a conventional technique of making reticle mask data, however, grid data is made in the permissible minimum actual size according to a mask design rule. So, even when each semiconductor chip being manufactured, includes a circuit pattern requiring not so high accuracy in grid, grid data is made with equally minute accuracy (small basic size).

As a result, processing time for making reticle mask data using the grid data, becomes long, besides, processing time for actually performing exposure, printing, comparative check, or data verification, on the basis of the obtained reticle mask data, also becomes long. These are problems.

Besides, particularly in a development process of a semiconductor device, design change in circuit or condition may be done, e.g., for improving the performance of the device. Such change brings change in layout pattern of, e.g., a reticle or a photomask.

FIG. 2 is a flowchart showing an outline of a process for making a reticle (reticle mask) on the basis of design data.

FIG. 2 shows the process of making a first reticle and the process of making a revised reticle.

At first, first design data 101 representing the layout pattern of a reticle is made with CAD. Data processing 111 is performed to the first design data 101 to make exposure data 102. Data processing 111 includes conversion of the first design data 101 into internal format data, figure logical operation, sizing, etc. The exposure data 102 thus obtained is output to a recording medium (not shown) and stored therein.

The obtained exposure data 102 is then supplied to an exposing apparatus, wherein exposure 112 of a resist and then etching are performed. A reticle 103 is thereby made. Printing 113 on a glass substrate is then performed with the reticle 103. A wafer 104 is thereby made. The wafer 104 thus obtained is subjected to a test 114 for, e.g., judging whether the circuit pattern formed on the substrate has its correct pattern, or examining the performance of the circuit pattern. When the conditions are satisfactory, the reticle completion 106 is confirmed.

If there is the necessity of, e.g., improving the performance, revise 115 of the design data of the reticle pattern is made with CAD to make revised design data 105. Data processing 116 is performed to the revised design data 105 in the same manner as data processing 111 as described above, to make revised exposure data 107. The revised exposure data 107 thus obtained is also output to the recording medium (not shown) and stored therein separately from the first exposure data 102.

Using the revised exposure data 107 thus obtained, exposure 112 is again performed in the exposing apparatus to make a reticle 103. Printing 113 is then performed to make a wafer 104. The wafer 104 thus newly obtained is subjected to a test 114. When the conditions are satisfactory, the reticle completion 106 is confirmed. If there is the necessity of further improvement, processing as described above is repeated.

With rapid engineering development, recent LSI development requests to make such design data and exposure data in a short time. However, the data quantity of such design data and exposure data is apt to increase with increase in density of circuit patterns. This increases processing load. For making such design data and exposure data in a short time, it is required to reduce the data quantity being processed, and steps of the making process.

In the conventional technique, however, when the revised exposure data is made from the revised design data, data processing is redundantly performed also to portions that have not changed from the respectively corresponding portions of the first design data. For this reason, the data quantity being processed and the number of steps are substantially the same as those in case of making the first exposure data. This will be described below with reference to drawings.

FIG. 3 is a representation for illustrating the operation of making first exposure data from first design data. Referring to FIG. 3, blocks a to f shown by broken lines in first design data 101, represent groups of cells in a semiconductor device, respectively. Each group forms a module. In each of the modules a to f, its peculiar circuit layout is symbolically drawn by CAD.

First exposure data 102 is made by performing data processing 111 on the basis of the first design data 101. Blocks A to F shown by broken lines in the first exposure data 102 represent modules of the exposure data made from the respective modules a to f in the first design data 101. In each of the modules A to F, pattern data is drawn which represents portions to be irradiated with electron beams in an exposing apparatus, and portions not to be irradiated.

Here, let it be supposed that the data quantity of the first design data 101 is "100" (which means that the data quantity being processed in the data processing apparatus is 100% the whole first design data 101). In this case, in data processing 111, the data quantity being processed in making the first exposure data 102 is "100" because data processing is performed to all the modules a to f in the first design data 101.

FIG. 4 is a representation for illustrating the operation of making revised exposure data from revised design data. Referring to FIG. 4, in revised design data 105, the module f in the first design data 101 shown in FIG. 3 has been revised to be a new module g. The other modules a to e have not been revised, so they are the same as those of the first design data 101.

Revised exposure data 107 is made by performing data processing 116 on the basis of the revised design data 105. The block G shown by a dot-dash line in the revised exposure data 107 represents a module of the exposure data made from the module g in the revised design data 105. The other blocks A to E represent modules of the exposure data made from the respective modules a to e in the revised design data 105.

When data processing 116 is performed to the revised design data 105, all the modules including the revised module g are input to the data processing apparatus. So, the data quantity of the revised design data 105 is "100". Because data processing is performed to all the modules a to e and g in the revised design data 105, it requires the same number of steps as that in case of processing the first design data 101. Besides, the data quantity being processed is "100".

Conventionally, data processing for revised data is redundantly performed also to the portions (modules a to e) which have not been revised, as described above. Consequently, there is a redundancy in data processing, and so the time for making the exposure data is long. Besides, since the revised design data 105 contains also the portions with no revise, the data quantity of the revised exposure data 107 made from the revised design data 105 becomes large. Consequently, the data quantity being stored in a recording medium also becomes large. Besides, in case of transferring the obtained exposure data to a factory where exposure is performed, the time for transferring becomes long because the data quantity of either of the first and revised exposure data is large. These are problems.

SUMMARY OF THE INVENTION

It is the first object of the present invention to shorten the making time of reticle mask data and the processing time of each process of exposure, printing, comparative check, and data verification on the basis of an obtained reticle mask.

It is the second object of the present invention to reduce the data quantity of revised exposure data and steps of making it in order to make the exposure data in a short time, store the exposure data with a small data quantity, and shorten the transference time of the exposure data.

According to the present invention, the minimum grid and the present area of a circuit element are obtained for each layer of circuit patterns given by design data, and an overlap area of present areas is obtained, and, on the basis of the result, it is determined whether the layers including the overlap area should be processed according to a single common grid or different grids, and a grid is obtained for each layer.

According to this feature of the present invention, each layer can be assigned the grid with the minimum accuracy required for the layer. As for a portion requiring a grid with not so minute accuracy, a grid with more minute accuracy than it requires may not be used. That is, a portion requiring no minute accuracy can be assigned a grid with relatively rough accuracy. This makes it possible to reduce considerably operation load in making reticle mask data (exposure data, check data, and verification data), and processing load in actually performing exposure, printing, comparative check, or data verification. As a result, the time for manufacturing LSI such as a semiconductor device can be considerably shortened. Besides, the rate of observance of the time limit of delivery can be improved.

According to another aspect of the present invention, the position of a revised portion is designated on revised design data when revised exposure data is made from the revised design data, data processing is performed only to the designated revised portion, and position data of the revised portion is added into a header or footer portion of the obtained revised exposure data.

According to this feature of the present invention, when revised exposure data is made from revised design data, data processing may not be performed to the duplicate portion of that of the design data before revision, and may be performed only to the revised portion designated on the revised design data. This makes it possible to reduce the number of processing steps and shorten the time for making the exposure data, besides, to reduce the data quantity of the revised exposure data. Because of the data quantity thus reduced, the data can be stored in a small data quantity, and transferred in a short transference time.

BRIEF DESCRIPTION OF THE DRAWINGS

FIG. 3 is a representation for illustrating a technique of making first exposure data;

FIG. 4 is a representation for illustrating a conventional technique of making revised exposure data;

FIGS. 6A to 6G are charts for illustrating operations of the analysis and classification section shown in FIG. 5, wherein FIG. 6A is for illustrating calculation of minimum grid, FIG. 6B for calculation of present area, FIG. 6C for calculation of overlap area, FIG. 6D for calculation of the number of exposure pixels, FIG. 6E for calculation of combination grid, FIG. 6F for detection of permissible grid, and FIG. 6G for calculation of largest throughput;

DETAILED DESCRIPTION OF THE PREFERRED EMBODIMENTS

Hereinafter, embodiments of the present invention will be described with reference to drawings.

First Embodiment

Figure 5:
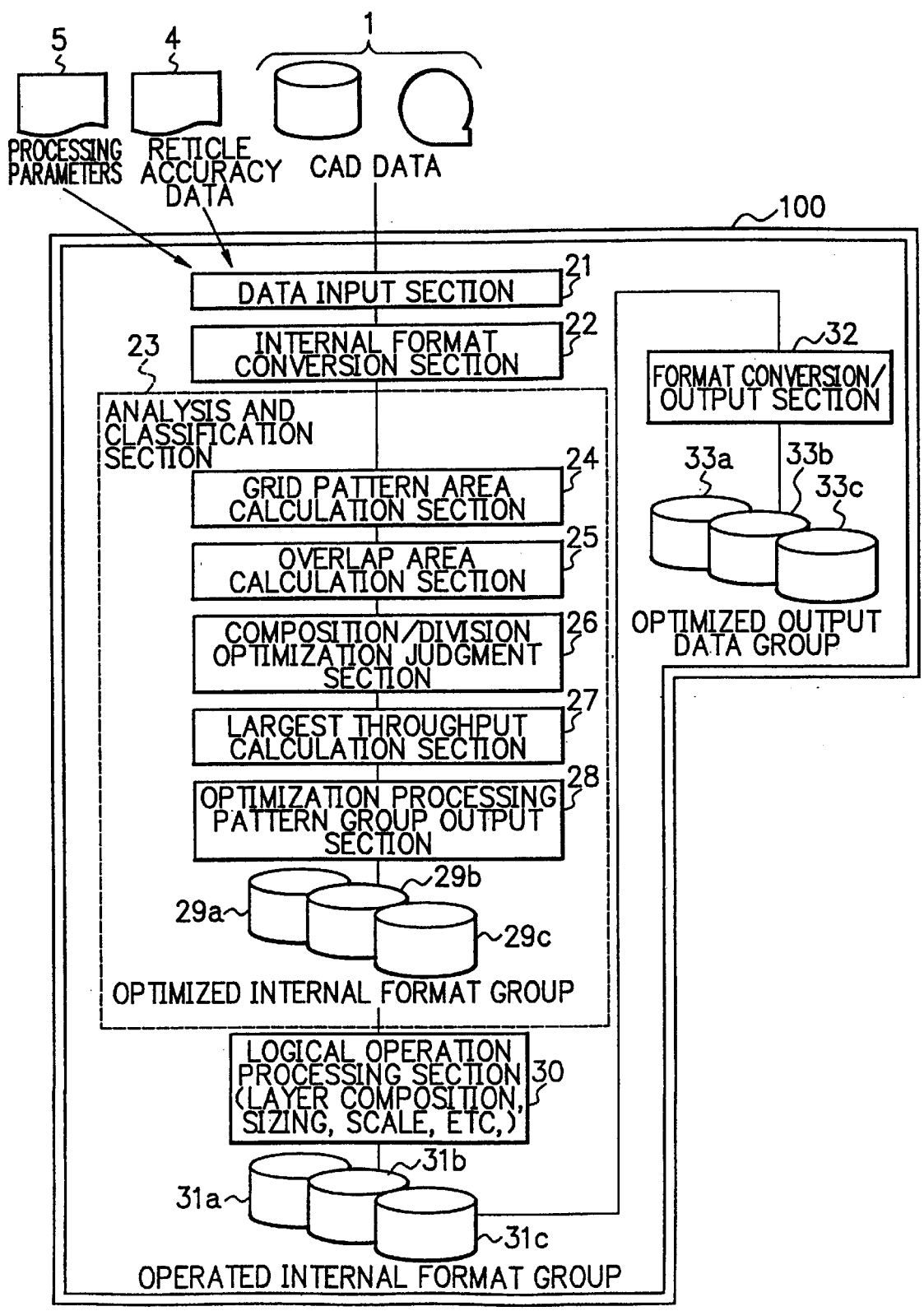
FIG. 5 is a block diagram showing the construction of a data processing apparatus according to the first embodiment of the present invention.

FIG. 5 is a block diagram showing the construction of a data processing apparatus according to the first embodiment of the present invention. FIGS. 6A to 6G are charts for illustrating operations of the analysis and classification section shown in FIG. 5. The first embodiment of the present invention will be described below with reference to these FIGS. 5 and 6A to 6G.

Referring to FIG. 5, CAD data 1 is design data that symbolically represents circuit layouts of, e.g., a semiconductor device being manufactured. Reticle accuracy data 4 gives information on permissible range of error in printing on wafers with a reticle mask made on the basis of the CAD data 1. Processing parameters 5 include various data such as layer composition data, sizing data, and scale data, as described before.

The data processing apparatus 100 according to this embodiment makes reticle mask data representing an layout pattern used as an original for processing wafers, on the basis of the CAD data 1, the reticle accuracy data 4, and the processing parameters 5. The reticle mask data thus obtained is exposure data, check data, or verification data.

In the data processing apparatus 100, a data input section 21 is for inputting the above CAD data 1, reticle accuracy data 4, and processing parameters 5 into the data processing apparatus 100. The data input section 21 comprises, e.g., an input device such as a keyboard or a mouse of a computer terminal. Internal format conversion section 22 converts the input CAD data 1, reticle accuracy data 4, or processing parameters 5 into data in accordance with the internal format of the data processing apparatus 100.

Analysis and classification section 23, which is the most characteristic feature of this embodiment, analyzes a circuit layout represented by the above CAD data 1, a mask design rule represented by the above reticle accuracy data 4 and processing parameters 5, or the like, to calculate the optimum grid data. The construction and operations of this analysis and classification section 23 will be described below using specific examples with reference to FIGS. 6A to 6G.

Figure 7:
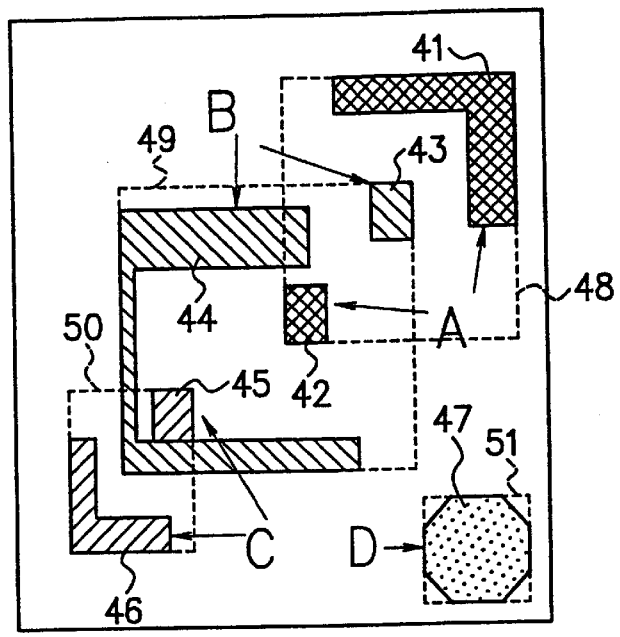
FIG. 7 is a schematic plan view of an example of circuit layout according to CAD data.

Here, let it be supposed that a circuit pattern of a semiconductor chip represented by the CAD data 1 is as shown in FIG. 7. In the example of FIG. 7, circuit elements on the chip are divided into four layers A to D according to the layer composition data in the processing parameters 5. More specifically, two circuit elements 41 and 42 belong to a layer A, two circuit elements 43 and 44 to a layer B, two circuit elements 45 and 46 to a layer C, and a circuit element 47 to a layer D.

A grid pattern area calculation section 24 in the analysis and classification section 23 shown in FIG. 5, which corresponds to a first operation section of the present invention, calculates the minimum grid on graphical coordinates for each layer of the circuit pattern of FIG. 7 represented by the CAD data 1. The grid pattern area calculation section 24 further calculates the minimum rectangular area where data (circuit elements) is present, for each layer. More specifically, it judges, for each layer, how fine grid is required for every edge of any circuit element being at a lattice point of the matrix defined according to the basic size of the grid data, and calculates, for each layer, the position and size of the minimum rectangular area (hereinafter, referred to as present area) including the circuit elements in the layer.

In FIG. 7, the present areas of the layers A to D are denoted by reference numerals 48 to 51, respectively. FIGS. 6A and 6B show the minimum grid and the size of the present area calculated for each of the layers A to D. In this example, the minimum grids of the layers A to D have been calculated to have their basic sizes of 0.01 µm, 0.02 µm, 0.05 µm, and 0.1 µm, respectively. The present areas thereof have been calculated to have their sizes of 6 µm$^2$, 10 µm$^2$, 2 µm$^2$, and 2 µm$^2$, respectively.

Figure 8:
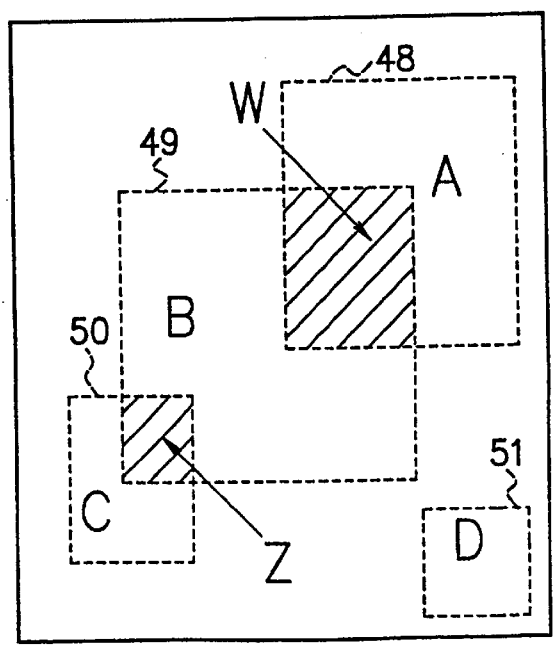
FIG. 8 is a schematic plan view showing examples of present areas and overlap areas.

An overlap area calculation section 25, which corresponds to a second operation section of the present invention, calculates the size of each overlap area in the present areas on the basis of the coordinates of the present areas of the layers obtained by the above grid pattern area calculation section 24. In this example, there are an overlap area W between the present area 48 of the layer A and the present area 49 of the layer B, and an overlap area Z between the present area 49 of the layer B and the present area 50 of the layer C, as shown in FIG. 8. FIG. 6C shows the calculated size of each of the overlap areas W and Z. In this example, the overlap areas W and Z have been calculated to have their sizes of 5 µm$^2$ and 1 µm$^2$, respectively.

A composition/division optimization judgment section 26, which corresponds to an optimization judgment section of the present invention, judges, for each overlap area, which of the following two cases is optimum. That is, as for each pair of layers (layers A and B, or layers B and C) including the overlap area W or Z obtained by the above overlap area calculation section 25, a case of processing a composite of the layers according to single grid data, and a case of separately processing the layers according to different grid data, are judged.

More specifically, when an exposing apparatus performs exposure according to a reticle mask being made, the apparatus laterally scans a chip from the left end of the chip and repeats such a lateral scan in order from the upper part to the lower part. In this case, accuracy in exposure (grid accuracy) can not be changed within each scanning line for characteristics of the exposing apparatus. For this reason, when exposure is performed to, e.g., two layers A and B including the overlap area W, it must be judged which is better of the manner of performing exposure once according to grid data commonly applicable to the layers A and B, and the manner of performing exposure twice according to the respective grid data calculated in relation to the layers A and B.

Technique of optimization judgement by this composition/division optimization judgment section 26 will be described below with reference to FIGS. 6D to 6F. The composition/division optimization judgment section 26 first calculates the number of exposure pixels in the present area of each of the layers A to D. The number of exposure pixels can be obtained by dividing the size of the corresponding present area (see FIG. 6B) obtained by the grid pattern area calculation section 24, by the basic size of the grid (see FIG. 6A) obtained by the same grid pattern area calculation section 24.

FIG. 6D shows calculation results of the number of exposure pixels. In this example, in relation to not only the minimum grid obtained for each layer by the grid pattern area calculation section 24, but also another grid applicable to the layer, the number of exposure pixels when the grid is applied, has been calculated. For example, as for the layer A, only the grid of 0.01 µm is applicable, so the number of exposure pixels when the grid is applied, has been calculated. As for the layer B, the grids of 0.01 µm and 0.02 µm are applicable, so the number of exposure pixels when each of the grids is applied, has been calculated. The same can apply to the other layers C and D.

The composition/division optimization judgment section 26 then calculates the maximum grid commonly applicable in case that the appropriate two of the layers A to D are combined (case of occurrence of an overlap area). FIG. 6E shows the calculation results. In this example, when the layer A is combined with one of the other layers B to D, the maximum grid commonly applicable is 0.01 µm in any case. The maximum grid commonly applicable is 0.01 µm when the layers B and C are combined, 0.02 µm when the layers B and D are combined, and 0.05 µm when the layers C and D are combined.

Further, the composition/division optimization judgment section 26 detects a permissible grid in each of the layers A to D. FIG. 6F shows detection results of such a permissible grid. For example, as for the layer A, the minimum grid obtained by the above grid pattern area calculation section 24, is 0.01 µm. There is no grid finer than it. So, only the grid of 0.01 µm is permissible. As for the layer B, the minimum grid obtained by the above grid pattern area calculation section 24, is 0.02 µm. So, the grids of 0.02 µm and 0.01 µm, which is a measure of 0.02 µm, are permissible.

As for the layer C, the minimum grid obtained by the above grid pattern area calculation section 24, is 0.05 µm. So, the grids of 0.05 µm and 0.01 µm, which is a measure of 0.05 µm, are permissible. As for the layer D, the minimum grid obtained by the above grid pattern area calculation section 24, is 0.1 µm. So, all the grids of 0.01 µm, 0.02 µm, 0.05 µm, and 0.1 µm, are permissible.

On the basis of the results shown in FIGS. 6D to 6F as described above, the composition/division optimization judgment section 26 checks as to which of the case of processing two layers whose present areas are overlapping (layers A and B, or layers B and C), with a common grid, and the case of processing the two layers with individual grids, brings about less pixels to be processed. This will be described below taking the case of the overlap area W between the layers A and B.

At first, as for the overlap area W between the layers A and B, the number of pixels in case of using the grid of the greatest common measure of both layers, is calculated. As shown in FIG. 6A, the minimum grid of the layer A is 0.01 µm, and that of the layer B is 0.02 µm. So, the grid of the greatest common measure is 0.01 µm. As shown in FIG. 6C, the size of the overlap area W is 5 µm$^2$. So, the number of pixels in this case is:

$$5 \div 0.01 = 500 \text{ (pixels)}.$$

Besides, the difference in pixels between the case of processing the layers A and B with the individual grids and the case of processing them with a common grid (difference in pixels due to change of grid), is calculated. In the present example, only the grid of 0.01 µm is common to the layers A and B. It is the minimum grid of the layer A. So, the layer A has no need of grid change. But, the layer B has need of grid change because its minimum grid is 0.02 μm. Consequently, only the difference in pixels in relation to the layer B is calculated.

Since the area of the layer B is 10 μm², the number of pixels in case of processing the layer B with the common grid of 0.01 μm, is:

10÷0.01=1000 (pixels).

The number of pixels in case of processing the layer B with the individual minimum grid of 0.02 μm, is:

10÷0.02=500 (pixels).

Hence, the difference between them is 500 pixels.

On the basis of the thus calculated number of pixels of the overlap area W in case of using the common grid, and the thus calculated difference in pixels in case of changing grid, the composition/division optimization judgment section 26 judges by the criteria (1) to (3) as shown below, which is better of the case of processing the layers A and B with the common grid, and the case of processing them with the individual grids:

(1) pixels of overlap area>difference in pixels due to grid change →processing the layers A and B in combination using the common grid;
(2) pixels of overlap area<difference in pixels due to grid change →processing the layers A and B in no combination using the individual grids; and
(3) pixels of overlap area=difference in pixels due to grid change →either will do.

In the above example, either of the number of pixels of the overlap area and the difference in pixels due to grid change, is 500 pixels. This corresponds to the above (3). Consequently, the layers A and B may be processed with either of the common grid and the individual grids. Since the case of performing exposure once with the common grid is more efficient than the case of performing exposure twice with the individual grids, it is preferable to employ the common grid. In the present example, processing with the common grid is selected.

Optimization judgment as to whether layers including an overlap area are to be processed in combination or separately, as described above, is performed likewise to the overlap area Z between the layers B and C. As for this overlap area Z, the number of pixels in case of using the grid of the greatest common measure of both layers, is:

1÷0.01=100 (pixels).

As for calculation of the difference in pixels due to grid change, only the grid of 0.01 μm is common to the layers B and C, and the minimum grids of the layers B and C are 0.02 μm and 0.05 μm, respectively. So, either of the layers B and C has need of grid change. In this case, the difference in pixels must be calculated in relation to either of the layers B and C.

The difference in pixels due to grid change in case of the layer B is 500 pixels like the above-described case. Since the area of the layer C is 2 μm², the number of pixels in case of processing this layer C with the common grid of 0.01 μm, is:

2÷0.01=200 (pixels).

The number of pixels in case of processing the layer C with the individual minimum grid of 0.05 μm, is:

2÷0.05=40 (pixels).

Hence, the difference between them is 160 pixels. Consequently, the difference in pixels due to grid change in the layers B and C is 660 pixels.

In this case, the number of pixels of the overlap area is 100 pixels, and the difference in pixels due to grid change is 660 pixels. This corresponds to the above (2). Consequently, it is more efficient to process the layers B and C with the individual grids, respectively. In this case, it is selected to process the layers B and C with the individual grids. By processing as described above, optimization judgment for each overlap area by the composition/division optimization judgment section 26 shown in FIG. 5, is completed.

A largest throughput calculation section 27, which corresponds to a third operation section of the present invention, prepares a layer combination table as shown in FIG. 6G, on the basis of the result of optimization judgment by the above composition/division optimization judgment section 26 and the detection result of permissible grids as shown in FIG. 6F. The largest throughput calculation section 27 thereby calculates as to which combination brings about the largest throughput (shortest processing time).

More specifically, when overlap areas of the layers A to D are not complicated, e.g., when there is only one overlap area W or Z, the grid determined by the composition/division optimization judgment section 26 can be used intact for realizing the largest throughput. However, as in the present example, when there are two overlap areas W and Z, and the layer B overlaps with not only the layer A but also the layer C, it must be further examined which grid is the best to be used for the layer B.

For this purpose, the largest throughput calculation section 27 prepares the layer combination table as shown in FIG. 6G, with effectively using the result of optimization judgment by the above composition/division optimization judgment section 26. In the table, as for the layers A and B, the optimization judgment result that the common grid of 0.01 μm should be used for the combination of the layers, is used intact (mark ☆).

As for the layers B and C, since the optimization judgment result that the individual grids should be used without combining the layers, has been obtained, the table indicates that the minimum grid of 0.05 μm of the layer C should be used (mark× in the left half). In this case, it is good if the layer B, which is the partner of the layer C, has been set to its minimum grid (0.02 μm). In the present example, however, the layer B has been set to the grid of 0.01 μm because of the connection with the layer A. So, as for the layer C, the grid of 0.01 μm has also been taken into consideration as another permissible grid to make sure (mark ★ in the right half).

As for the remaining layer D, there is no overlap area with any other layer. So, in the table, all combinations of the permissible grids shown in FIG. 6F have been taken into consideration.

On the basis of the layer combination table thus prepared, the largest throughput calculation section 27 calculates the total number of pixels of each combination of the layers A to D. FIG. 6G shows the total number of pixels of each combination in its lowermost line.

Next, an optimization processing pattern group output section 28 outputs, as optimum processing patterns, the combination of processing patterns for the largest throughput, i.e., the combination of grids having the smallest total number of pixels calculated by the above largest throughput calculation section 27. At this time, the processing patterns of different grids are output as different files, respectively. In the present example, since each combination of grids shown in the leftmost column in FIG. 6G is to realize the largest throughput, three processing patterns of the common grid (0.01 μm) for the layers A and B, the minimum grid (0.05 μm) for the layer C, and the minimum grid (0.1 μm) for the layer D, are output as an optimized internal format group 29a to 29c.

In the above-described operation of the analysis and classification section 23, the table as shown in FIGS. 6A to 6G is used for making the description easy to understand. If a similar process is performed in the apparatus, such a table may not always be prepared in data processing being actually performed by the analysis and classification section 23.

A logical operation processing section 30 performs logical operation to the optimized internal format group 29a to 29c thus output, to perform processing of layer composition, sizing, enlargement, or the like, given by the processing parameters 5. An operated internal format group 31a to 31c is thereby made. A format conversion/output section 32 then converts, in format, the operated internal format group 31a to 31c thus obtained, into data for exposure, check, or verification, and outputs it. An optimized output data group 33a to 33c, which is reticle mask data, is thereby made.

As described above in detail, in the first embodiment, the minimum grid and an overlap area in the present area are obtained for each layer of the circuit patterns represented by the CAD data 1. From the result, the optimum grid is obtained for each layer such that the total number of pixels in relation to a combination of layers is the smallest. In this fashion, a portion requiring not so minute accuracy can be assigned a grid with relatively rough accuracy.

Consequently, in performing logical operation to internal format data in which each layer has been assigned grid data as described above, processing load can be relieved in comparison with a conventional manner. Besides, the time for making reticle mask data (exposure data, check data, and verification data) can be shortened. Further, in actually performing exposure, printing, comparative check, or data verification, processing load can be considerably relieved in comparison with the conventional manner in which each layer is processed using a grid with equally minute accuracy, and the time for each process can be shortened. As a result of the above effects, the time for manufacturing LSI such as a semiconductor device can be considerably shortened.

Second Embodiment

Figure 9:
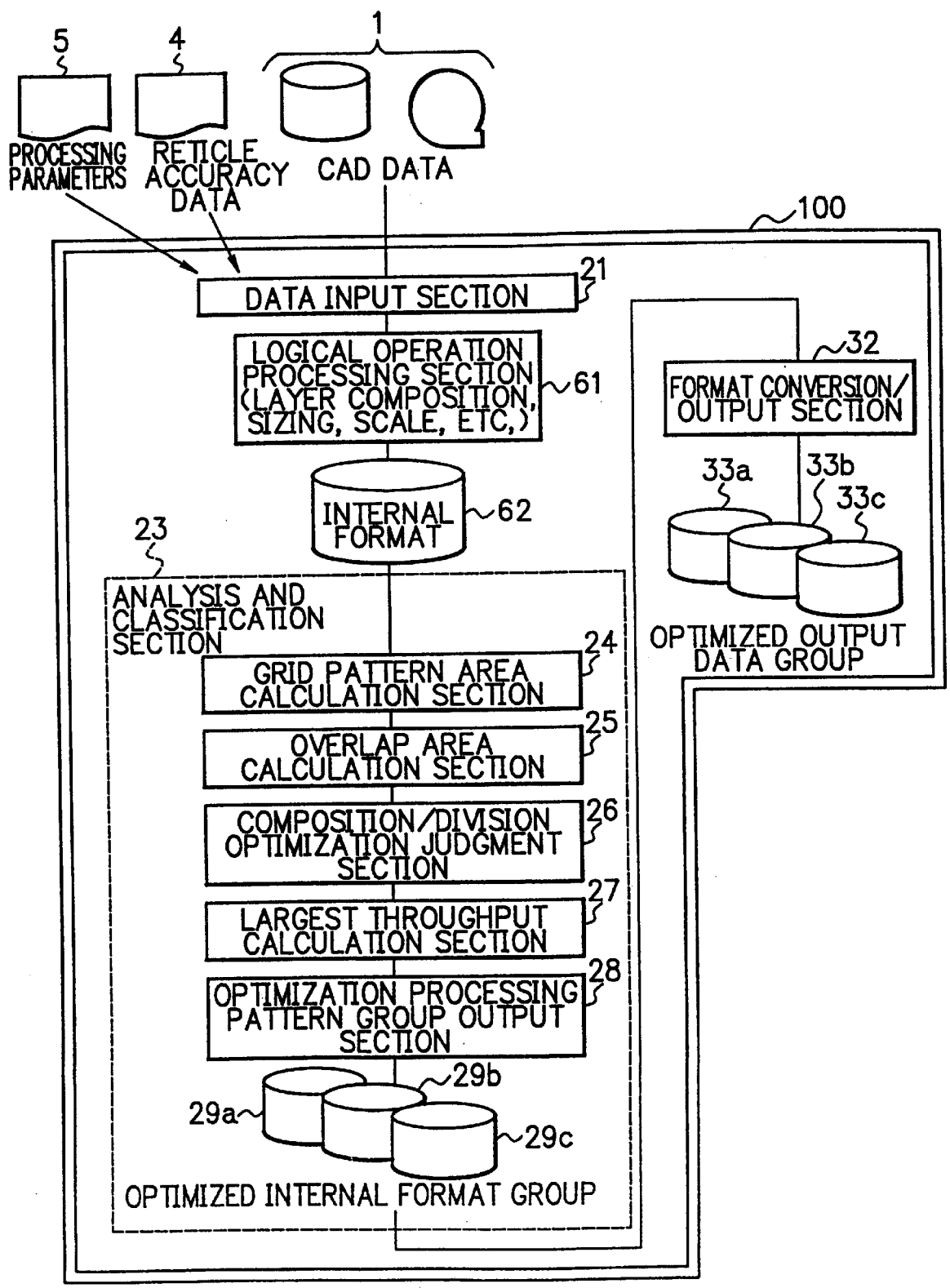
FIG. 9 is a block diagram showing the construction of a data processing apparatus according to the second embodiment of the present invention.

Next, the second embodiment of the present invention will be described. FIG. 9 is a block diagram showing the construction of a data processing apparatus according to the second embodiment. In FIG. 9, each block representing the same function as that in FIG. 5 is denoted by the same reference as that in FIG. 5. In the above first embodiment, logical operation such as layer composition, sizing, or enlargement, is performed after optimization of grid data for each layer. Contrastingly in the second embodiment, such logical operation is performed before optimization of grid data.

As shown in FIG. 9, a logical operation processing section 61 performs logical operation to CAD data 1, reticle accuracy data 4, and processing parameters 5 being input through the data input section 21. Operated internal format data 62 is thereby made. The analysis and classification section 23 performs data processing to the internal format data 62 in the same manner as that described with FIGS. 6 to 8. The format conversion/output section 32 converts, in format, optimized internal format group 29a to 29c made by the analysis and classification section 23, into data for exposure, check, or verification, and outputs it.

Also in the second embodiment thus constructed, a portion requiring not so minute accuracy can be assigned a grid with relatively rough accuracy, like the first embodiment. Besides, when logical operation is performed, no grid data has been obtained yet. So, logical operation can be performed at a level of symbolic layout made by CAD. As a result, operation load can be relieved and the time for making reticle mask data can be shortened.

Further, in actually performing exposure, printing, comparative check, or data verification, processing load can be considerably relieved in comparison with the conventional manner in which each layer is processed using a grid with equally minute accuracy, and the time for each process can be shortened.

As a result of the above effects, the time for manufacturing LSI such as a semiconductor device can be considerably shortened.

Each of the data processing apparatus of the above-described first and second embodiments comprises CPU or MPU, RAM, ROM, etc., of a computer, and is realized by operation of a program stored in RAM or ROM. Therefore, the same can also be realized by recording a program to cause a computer realize the above functions, in a recording medium such as CD-ROM, and making the computer read it. As a recording medium to record such a program, other than CD-ROM, a floppy disk, a hard disk, a magnetic tape, an optical magnetic disk, a nonvolatile memory card, or the like, can be used.

Besides, not only in case that a computer executes a supplied program to realize the functions of the above embodiments, but also in case that the program cooperates with OS (Operating System), another application software program, or the like, operating in the computer to realize the functions of the above embodiments, or in case that all or part of the process of the supplied program is performed by a functional extension board or unit of the computer to realize the functions of the above embodiments, the program is contained in the embodiments of the present invention.

Third Embodiment

Figure 1:
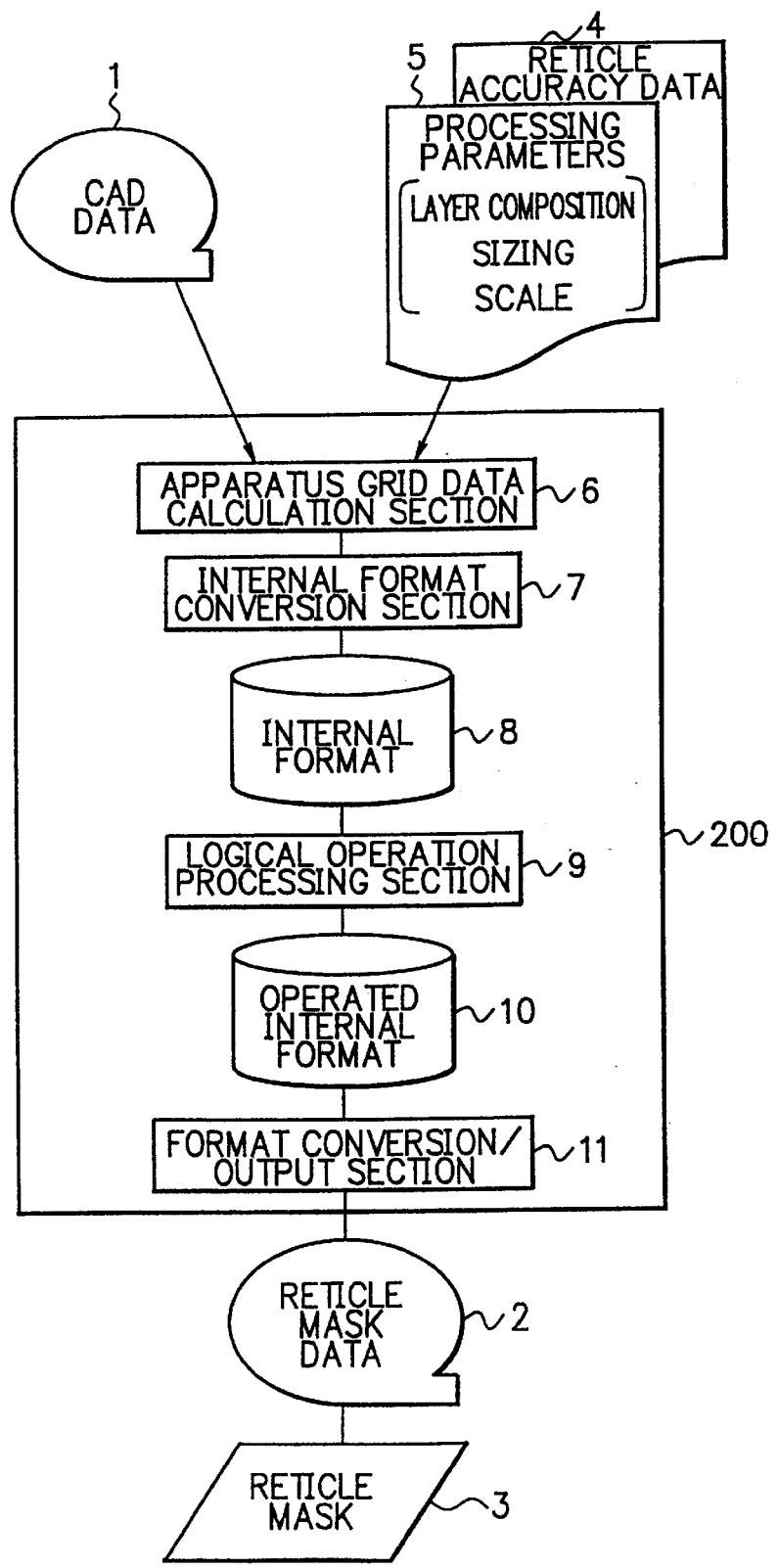
FIG. 1 is a block diagram showing the construction of a conventional data processing apparatus.
Figure 2:
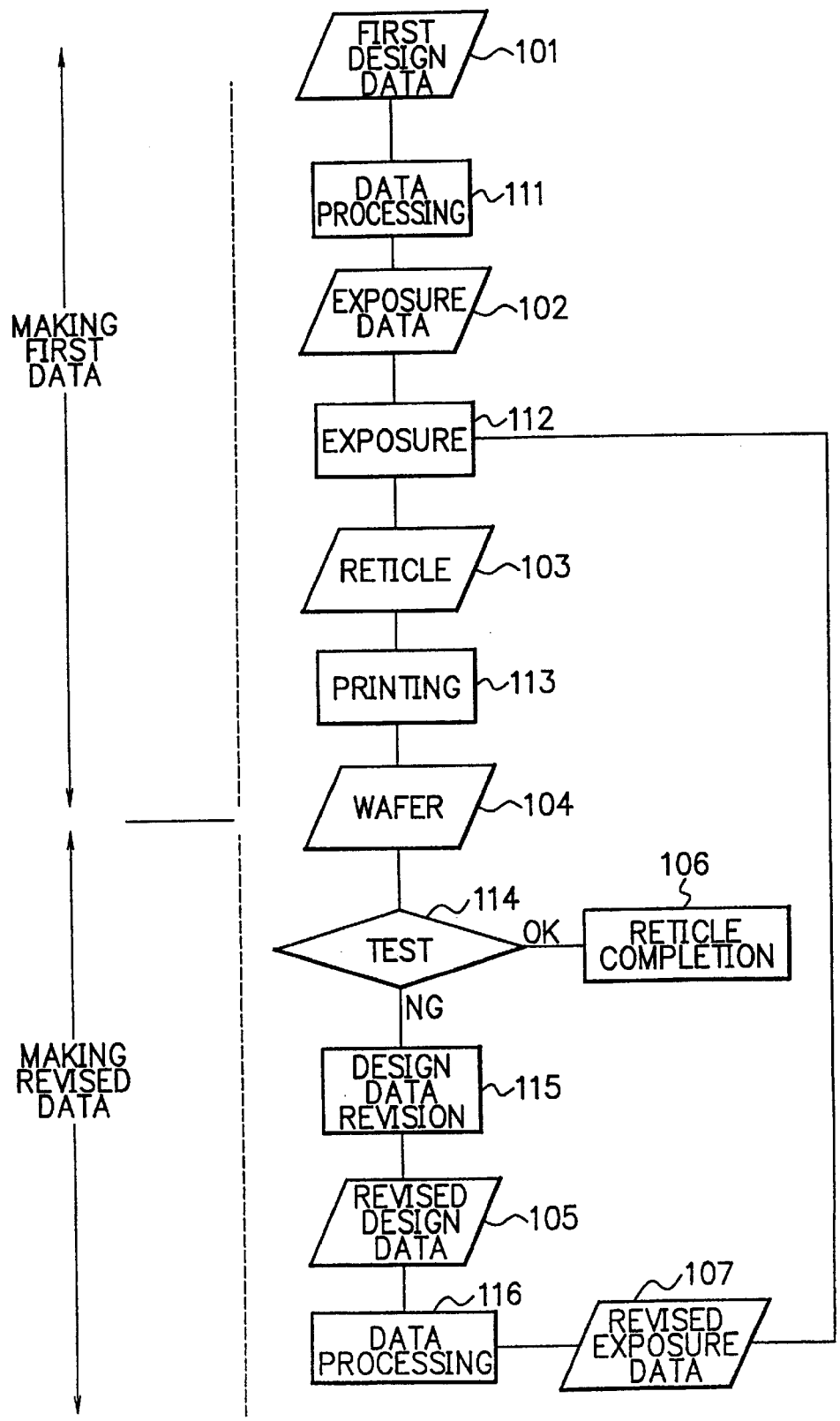
FIG. 2 is a flowchart showing a process flow until a reticle is made from design data.
Figure 10:
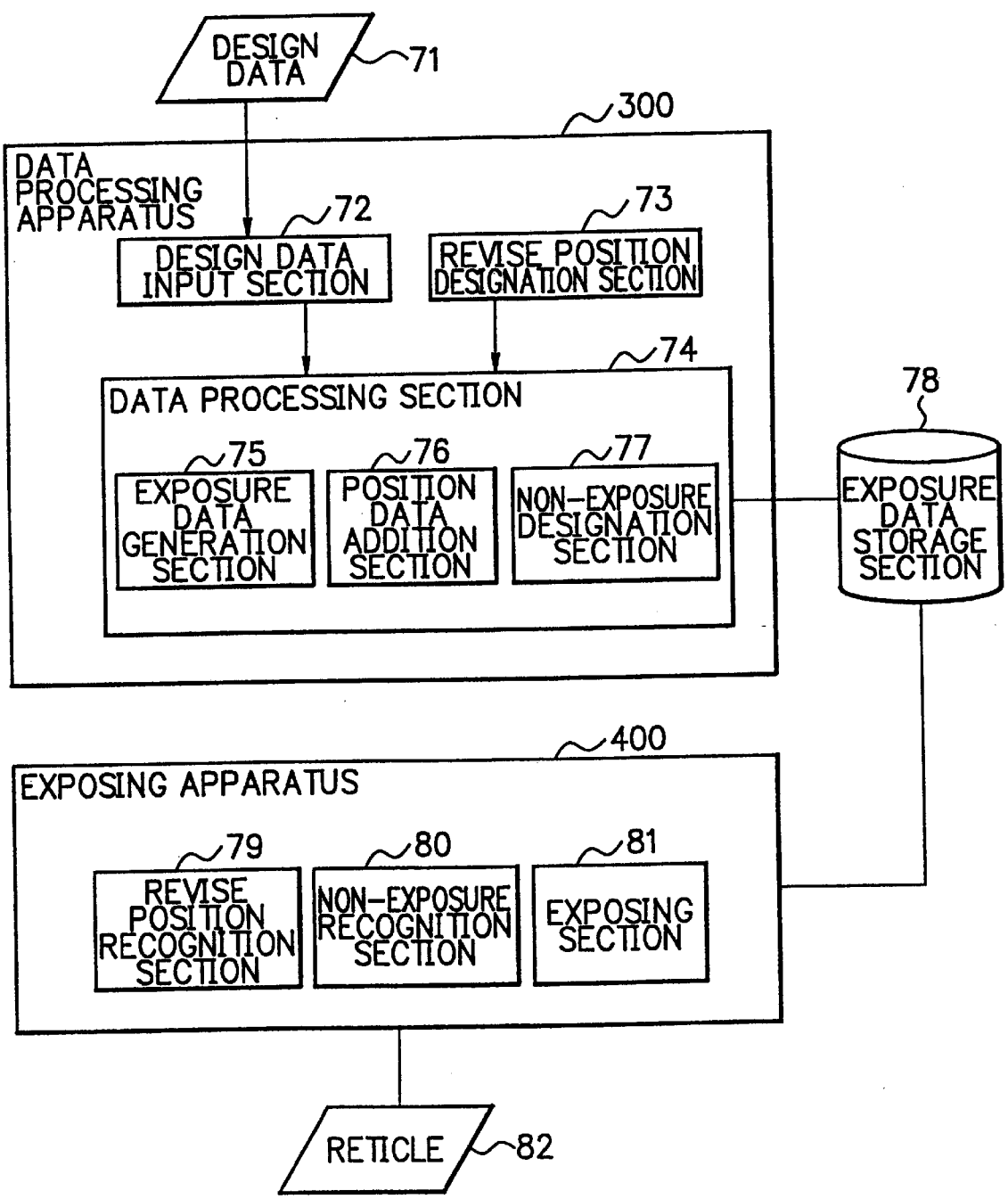
FIG. 10 is a block diagram showing the construction of each of a data processing apparatus and an exposing apparatus according to the third embodiment of the present invention.

Next, the third embodiment of the present invention will be described. FIG. 10 is a block diagram showing the construction of each of a data processing apparatus and an exposing apparatus according to the third embodiment. In FIG. 10, design data 71 made by CAD, symbolically represents circuit layouts of a semiconductor device being manufactured. The design data 71 includes first design data 101 and revised design data 105 as shown in FIG. 2.

The data processing apparatus 300 according to this embodiment comprises a design data input section 72, a revise position designation section 73, and a data processing section 74, to make exposure data representing a reticle pattern used as an original for processing wafers, from the design data 71. The design data input section 72 is for inputting the first or revised design data 71 into the data processing apparatus 300. The design data input section 72 comprises, e.g., an input device such as a keyboard or a mouse of a computer terminal.

The revise position designation section 73 is for designating the position of a revised portion in the revised design data 71 when the revised design data 71 is input. More specifically, coordinate data in the whole revised design data 71 is designated as information on the area where revise has been made. For this purpose, an operator who is to make exposure data, may designate it with the input device of the computer terminal, or the computer terminal itself may designate it automatically. The operation in case of automatically designating coordinate data, will be described later.

The data processing section 74 comprises an exposure data generation section 75, a position data addition section 76, and a non-exposure designation section 77. The exposure data generation section 75 performs data processing of conversion into internal format data, figure logical operation, sizing, etc., to the first or revised design data 71 to make first or revised exposure data. The exposure data thus obtained is output to an exposure data storage section 78 comprising a recording medium such as a hard disk or a floppy disk, and stored therein individually as to whether it is first data or revised data.

The position data addition section 76 adds position data (coordinate data) that represents a revise position designated by the above revise position designation section 73, into the header or footer portion of the revised exposure data made by the above exposure data generation section 75. The non-exposure designation section 77 designates the revise position designated by the above revise position designation section 73, as a non-exposure portion to the first exposure data stored in the above exposure data storage section 78.

The exposing apparatus 400 according to this embodiment comprises a revise position recognition section 79, a non-exposure recognition section 80, and an exposing section 81, to make a reticle 82 by exposing a resist on the basis of the first and revised exposure data stored in the above exposure data storage section 78.

The revise position recognition section 79 recognizes the position of a revised portion in the whole revised exposure data on the basis of the position data described in the header or footer portion of the revised exposure data. The non-exposure recognition section 80 recognizes the position of the non-exposure portion designated by the above nonexposure designation section 77, in the first exposure data.

The exposing section 81 performs exposure with the first and revised exposure data on the basis of the recognition result by the above revise position recognition section 79 and non-exposure recognition section 80. More specifically, when a first reticle 82 is made, usual exposure is performed according to the first exposure data. When a revised reticle 82 is made, both the first and revised exposure data are used. In this case, when exposure is performed based on the first exposure data, the portion is exposed except the non-exposure portion recognized by the non-exposure recognition section 80. When exposure is performed based on the revised exposure data, only the revise position is exposed which has been recognized by the revise position recognition section 79.

The Operations of making exposure data from design data will be described below with a specific example. The operation of making first exposure data from first design data will be described first. The operation in this case is quite the same as that shown in FIG. 3. So, the duplicate description is omitted here.

Figure 11:
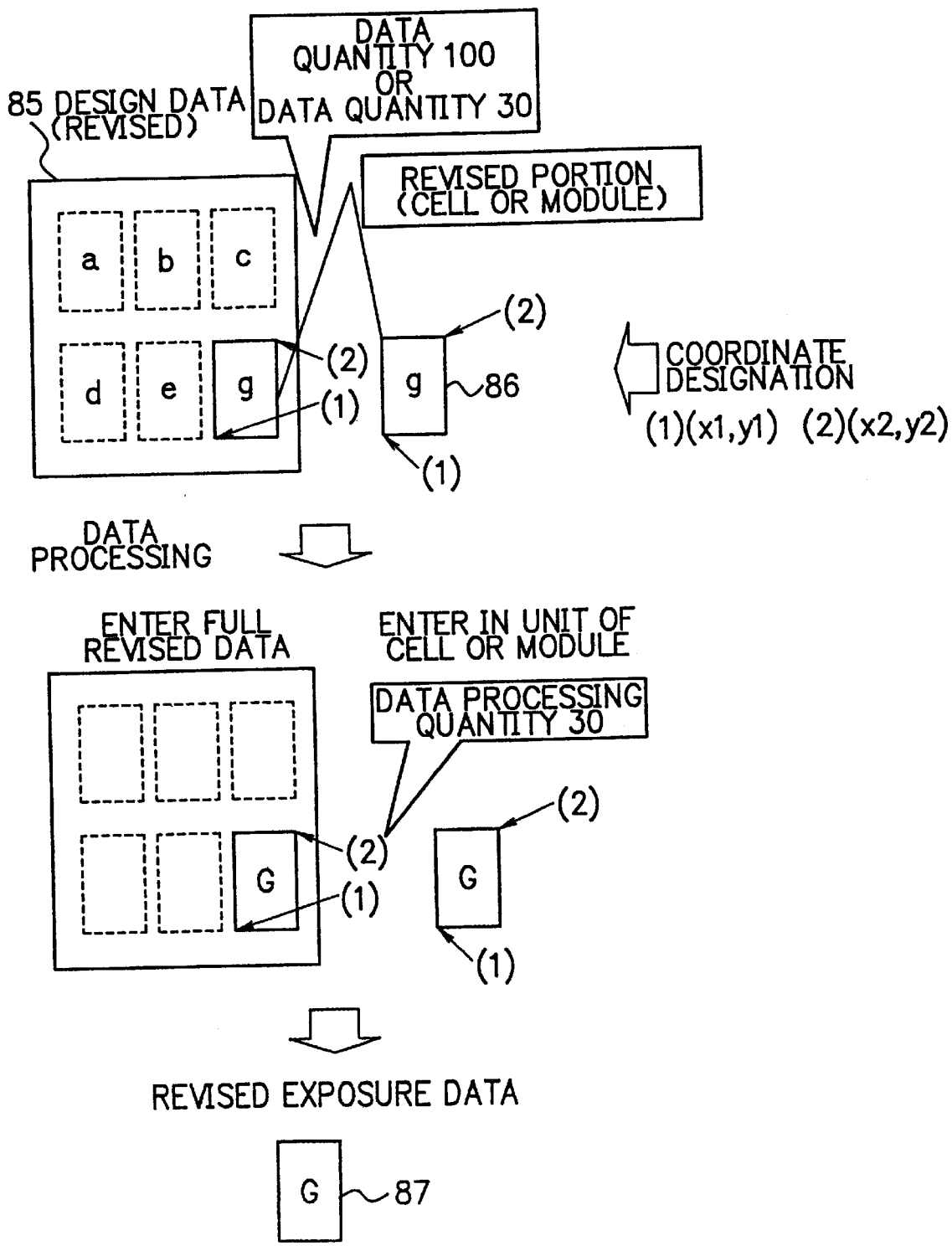
FIG. 11 is a representation for illustrating a technique of making revised exposure data according to the third embodiment.

The operation of making revised exposure data from revised design data, is illustrated in FIG. 11. Referring to FIG. 11, in revised design data 85, the module f in the first design data 101 shown in FIG. 3 has been revised to be a new module g. The other modules a to e are the same as those of the first design data 101. Revised design data 86 contains only the revised module g. Either of the revised design data 85 and 86 corresponds to the design data 71 in FIG. 10.

When the design data 71 is input through the design data input section 72, it is possible to input the full revised design data 85 containing the nonrevised modules a to e in addition to the actually revised module g, or it is also possible to input the revised design data 86 containing only the actually revised module g.

In case of inputting the full revised design data 85, the data quantity of the revised design data 85 is "100". Contrastingly in case of inputting the revised design data 86 containing only the module g, the data quantity of the revised design data 86 is only that corresponding to the module g, which is, e.g., "30".

When the revised design data is input in either manner, the area of the revised portion in unit of cell or module is designated with coordinates or the like. In the example of FIG. 11, the coordinates of the positions shown by (1) and (2) are designated. This may be performed by an operator who is to make exposure data, designating them with an input device of a computer terminal, or the computer terminal itself designating them automatically, as described before.

In case of automatically designating the coordinate data, the area of the revised module g (frame shown by a dot-dash line) is described in the revised design data 85 as actual data. The circuit pattern (not shown) within the frame is used for data processing. The data of the frame itself is designated to use as coordinate data, and thereby the computer terminal automatically designates the coordinate data out of the frame data as data representing the revised position.

Data processing is performed to only the area (the portion of the module g indicated by the coordinate data (1) and (2)) designated on the revised design data as the revised portion. At this time, the coordinate data (1) and (2) is described in the header or footer portion of the revised exposure data 87 obtained, as position data representing the revised area.

For example, when the full revised design data 85 is input, data processing is performed to only the module g of the revised portion among the modules a to e and g contained in the revised design data 85, to make a module G of the revised exposure data 87. When the revised design data 86 containing only the module g is input, data processing is performed to the input module g to make the module G of the revised exposure data 87. Consequently, the data processing quantity in making the revised exposure data 87 from the revised design data 85 or 86, is "30" in case of inputting the design data in either pattern.

Figure 12:
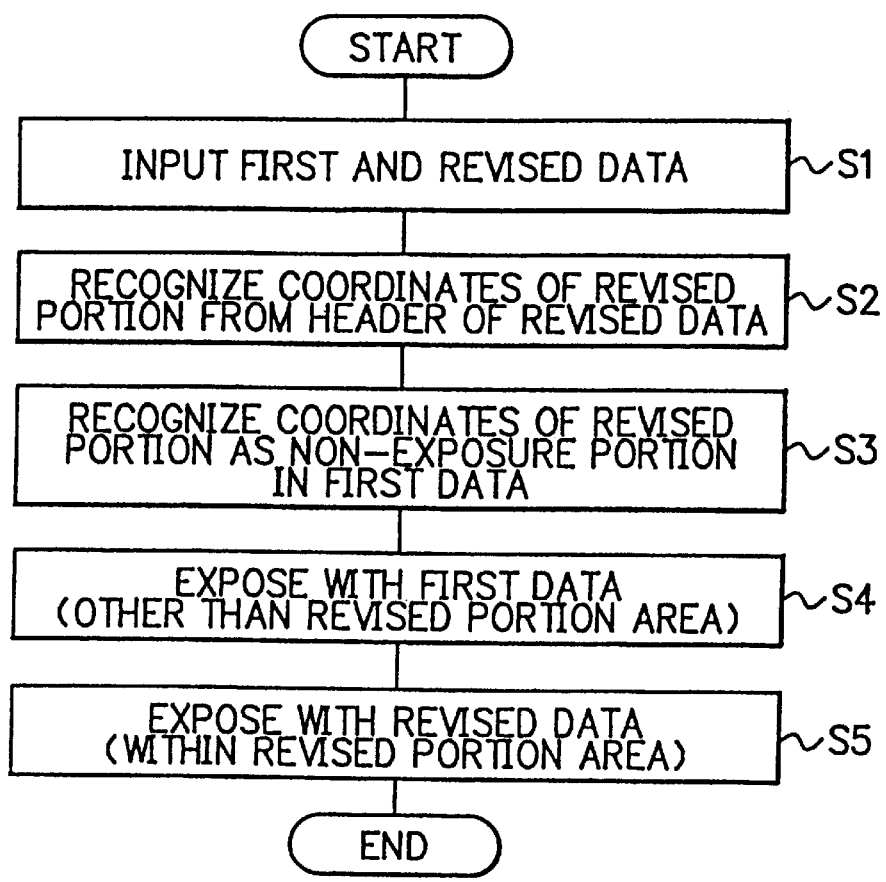
FIG. 12 is a flowchart showing an example of operation of the exposing apparatus according to the third embodiment.

Next, the operation of the exposing apparatus 400 when a revised reticle is made by performing exposure with the exposure data thus obtained, will be described with reference to the flowchart shown in FIG. 12.

First at the step S1, the first and revised exposure data is input to the exposing apparatus 400 from the exposure data storage section 78. At the step S2, the revise position recognition section 79 recognizes the coordinates of the revised portion described in the header or footer portion of the input revised exposure data.

At the step S3, the non-exposure recognition section 80 recognizes the coordinates of the revised portion described in the header or footer portion of the input revised exposure data, as a non-exposure portion in the first exposure data. At the step S4, on the basis of the first exposure data, exposure is performed to the portion (portion corresponding to the modules A to E in the first exposure data 102 shown in FIG. 3) other than the area of the revised portion recognized as the non-exposure portion. At the step S5, on the basis of the revised exposure data, exposure is performed within the area of the revised portion (portion corresponding to the module G shown in FIG. 11) to complete a revised reticle.

In this example, exposure based on the revised exposure data is performed after exposure based on the first exposure data. The order of exposure may be reversed. Besides, exposure may be performed with properly changing the first and revised exposure data. More specifically, the exposing apparatus 400 laterally scans a chip from the left end of the chip and repeats such a lateral scan in order from the upper part to the lower part. So, for example, in case that the module B in the modules A to F has been revised, the first and revised exposure data may be changed such that the revised exposure data is used when scanning by the exposing apparatus 400 comes to the portion of the module B, and the first exposure data is used when scanning is performed to the portions of the other modules.

As described above, in the third embodiment, when the revised exposure data is made from the revised design data, not the full revised design data is processed, but only the area actually revised is processed. As a result, the number of processing steps can be considerably reduced. Besides, since the obtained revised exposure data contains only the data of the revised area, the exposure data can be stored and managed in the exposure data storage section 78 with a small data quantity. When the obtained exposure data is transferred via a network, the time for transference can be shortened.

Figure 13:
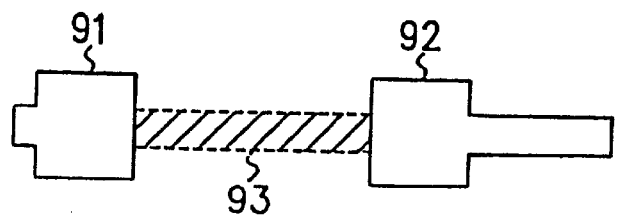
FIG. 13 is a representation showing an example in which an arbitrary portion in first exposure data is designated as a non-exposed portion.

The third embodiment has the further merit that an arbitrary portion can be designated on the first exposure data to be a non-exposure portion, by describing arbitrary coordinate data in the header or footer portion of the revised exposure data. FIG. 13 is for illustrating this merit. In FIG. 13, each of the reference numerals 91 to 93 denotes a circuit pattern in the first exposure data. In them, the portion 93 shown by slanted lines is the portion designated as a non-exposure portion.

In this manner, the third embodiment can easily cope with the case that revised exposure data in which an arbitrary portion in the first exposure data has been eliminated, is to be obtained, without actually making the revised exposure data, only by describing the corresponding coordinate data in the header or footer portion. Consequently, in comparison with the conventional manner in which the revised design data is entirely remade to eliminate the arbitrary portion and data processing is performed to the new revised design data to make the revised exposure data, the labor and time for making such revised exposure data can be considerably reduced.

Each of the data processing apparatus and the exposing apparatus of the above-described third embodiment comprises CPU or MPU, RAM, ROM, etc., of a computer, and is realized by operation of a program stored in RAM or ROM. Therefore, the same can also be realized by recording a program to cause a computer realize the above functions, in a recording medium such as CD-ROM, and making the computer read it. As a recording medium to record such a program, other than CD-ROM, a floppy disk, a hard disk, a magnetic tape, an optical magnetic disk, a nonvolatile memory card, or the like, can be used.

Besides, not only in case that a computer executes a supplied program to realize the functions of the above embodiment, but also in case that the program cooperates with OS (Operating System), another application software program, or the like, operating in the computer to realize the functions of the above embodiment, or in case that all or part of the process of the supplied program is performed by a functional extension board or unit of the computer to realize the functions of the above embodiment, the program is contained in the embodiment of the present invention.

The above-described first to third embodiments only show specific examples in embodying the present invention. Therefore, the technical scope of the present invention should not restrictedly be interpreted with these. That is, the present invention can be embodied in various forms without departing from its spirit or its principal feature.

What is claimed is:

1. A data processing method for making reticle mask data from design data, comprising the steps of:

calculating a minimum grid and a present area of a circuit element for each of plural layers of circuit patterns given by said design data;

calculating an overlap area of present areas;

determining, on the basis of a result of said calculating steps, whether the layers, including each said overlap area, should be processed according to a single common grid or different grids; and optimizing, based on a result of said determining step, a grid for each layer.

2. A method according to claim 1, further comprising the step of:

performing a logical operation based on processing parameters to data generated from said design data, on the basis of the grid optimized for each layer.

3. A method according to claim 1, wherein processing for calculating the minimum grid, the present area, and an overlap area, is performed to data generated by performing a logical operation based on processing parameters to said design data.

4. A method according to claim 1, further comprising the steps of:

obtaining a number of pixels of said overlap area using the grid that is a greatest common measure of the respective minimum grids for the layers including said overlap area;

obtaining a difference in pixels between a case of processing the layers with their individual minimum grids and a case of processing the layers with the grid of the greatest common measure; and comparing the number of pixels of said overlap area and said difference in pixels to determine whether the layers including said overlap area should be processed according to the single common grid or different grids.

5. A method according to claim 1, wherein said step of optimizing the grid for each layer obtains a grid having a smallest total number of pixels, of all layers.

6. A data processing apparatus for making reticle mask data from design data, comprising:

a first operation section calculating a minimum grid and a present area of a circuit element for each layer of plural layers of circuit patterns given by said design data;

a second operation section calculating an overlap area of present areas; and an optimization judgment section judging by a criterion whether the layers, including said overlap area obtained by said second operation section, should be processed according to a single common grid or different grids.

7. A reticle mask that is made in accordance with reticle mask data made from design data by the steps of:

calculating a minimum grid and a present area of a circuit element for each of plural layers of circuit patterns given by said design data;

calculating an overlap area of present areas;

determining on the basis of a result of said calculating steps, whether the layers, including each said overlap area, should be processed according to a single common grid or different grids; and obtaining a grid for each layer to make said reticle mask data.

8. A computer-readable recording medium recording thereon a program to cause a computer to perform:

a process of calculating a minimum grid and a present area of a circuit element for each of plural layers of circuit patterns given by design data, and calculating an overlap area of present areas;

a process of determining whether the layers including said overlap area should be processed according to a single common grid or different grids, on the basis of the calculated minimum grid and present area and the calculated overlap area; and a process of optimizing a grid for each layer on the basis of the determination result.

* * * * *

UNITED STATES PATENT AND TRADEMARK OFFICE
CERTIFICATE OF CORRECTION

PATENT NO. : 6,507,944 B1
DATED : January 14, 2003
INVENTOR(S) : Kenji Kikuchi et al.

It is certified that error appears in the above-identified patent and that said Letters Patent is hereby corrected as shown below:

<u>Title page,</u>
Item [75], Inventors, change "Ilduka" to -- Iiduka --.

Signed and Sealed this

Twenty-second Day of July, 2003

JAMES E. ROGAN
*Director of the United States Patent and Trademark Office*